United States Patent [19]

Parsons et al.

[11] 4,252,408
[45] Feb. 24, 1981

[54] DIRECTIONALLY SOLIDIFIED EUTECTIC STRUCTURE AND METHOD OF FORMING THE SAME

[75] Inventors: James D. Parsons; Alfred S. Yue, both of Los Angeles, Calif.

[73] Assignee: The Regents of the University of California, Berkeley, Calif.

[21] Appl. No.: 19,129

[22] Filed: Mar. 9, 1979

[51] Int. Cl.³ .................. G02B 5/16; C04B 35/00; C03C 23/20

[52] U.S. Cl. .................. 350/96.33; 65/4 A; 65/4 B; 106/39.5; 106/50; 106/73.1; 313/475; 350/96.24; 350/96.30; 350/96.34

[58] Field of Search .............. 350/96.24, 96.25, 96.30, 350/96.33, 96.34; 65/4 A, 4 B; 106/39.5, 50, 73.1; 23/304; 313/475

[56] References Cited

U.S. PATENT DOCUMENTS

| 3,625,669 | 12/1971 | Norton | 65/4 |
| 3,650,780 | 3/1972 | Connelly | 106/47 Q |
| 3,729,299 | 4/1978 | Norton | 65/12 |
| 3,764,195 | 10/1973 | Blank et al. | 350/96.14 |
| 3,765,956 | 10/1973 | Chou | 148/33 |
| 3,837,827 | 9/1974 | Carruthers et al. | 65/30 |
| 3,859,071 | 1/1975 | Beasley et al. | 65/11 R |
| 3,870,399 | 3/1975 | Randall et al. | 350/96.25 |
| 3,871,852 | 3/1975 | Pei | 65/4 |
| 3,897,257 | 7/1975 | Gupta | 106/73.2 |
| 3,929,497 | 12/1975 | Clark-Monks | 106/50 |
| 3,980,459 | 9/1976 | Li | 65/18 |

OTHER PUBLICATIONS

Parsons et al., "Unidirectionally Solidified Binary Eutectic Waveguide", *American Assoc. of Crystal Growth/West*, Jun. 4, 1976.
F. S. Galasso "Unidirectionally Solidified Eutectics for Optical Electronics & Magnetic Applications", *Journal of Metals*, Jun., 1967, pp. 17-21.
F. S. Galasso et al., "Recent Studies of Eutectics for Nonstructural Applica.", *Journal of Metals*, Jun., 1970, pp. 40-44.
J. A. Batt, et al., "Optical Properties of Unidirectionally Solidified NaF-NaCl Eutectic", *Ceramic Bulletin*, vol. 48, No. 6, 1969, pp. 622-626.

*Primary Examiner*—Stewart J. Levy
*Attorney, Agent, or Firm*—Poms, Smith, Lande & Rose

[57] ABSTRACT

A directionally solidified, optically conductive eutectic system and method of forming the same. A Type II eutectic which divides into fiber and matrix phases when directionally solidified consists of a fiber phase having a lesser molecular weight but higher refractive index than the matrix phase. The resulting fiber array is optically conductive, and may be used to advantage in applications such as CRT screens, waveguides, fiber optic image intensifiers, and lasers.

9 Claims, 9 Drawing Figures

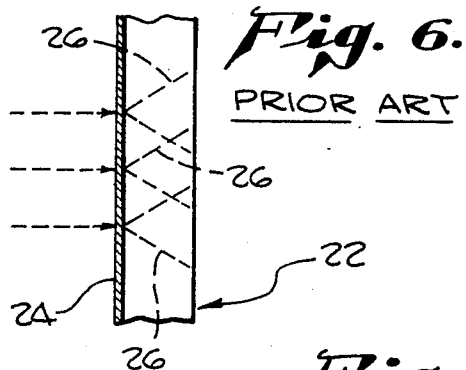
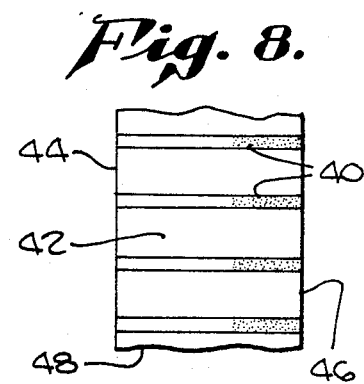
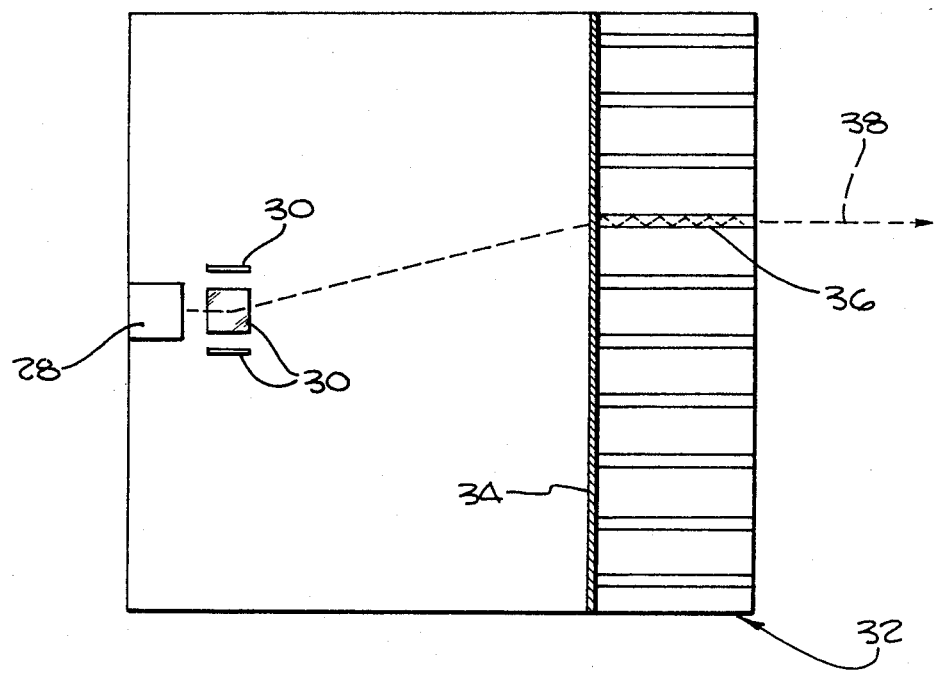
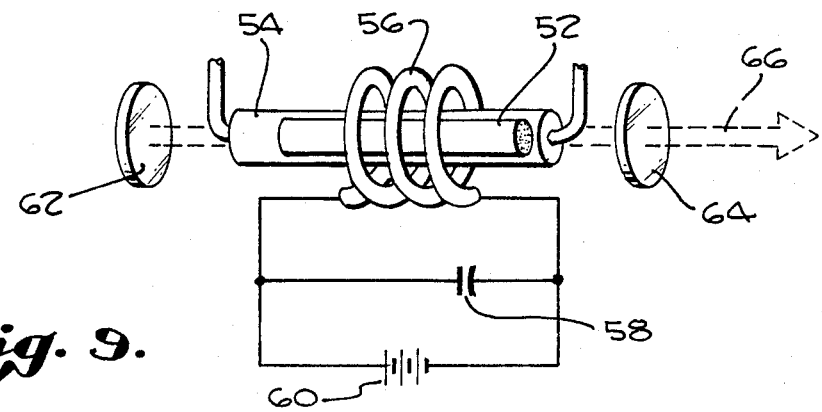

DIRECTIONALLY SOLIDIFIED EUTECTIC STRUCTURE AND METHOD OF FORMING THE SAME

BACKGROUND OF THE INVENTION

A. Field of the Invention

This invention relates to directionally solidified eutectic structures and methods, and more particularly to a directionally solidifed eutectic structure having a fiber phase which provides an optical path, the method of forming the same, and applications employing such structure.

B. Description of the Prior Art

It is known in the art that certain eutectic systems when directionally solidified will separate into their constituent components with one component forming a matrix phase and the other component a plurality of fibers. The fibers are generally colinear and distributed in hexagonal array. The diameter of each fiber is inversely proportional to the rate of which the eutectic is solidified, while the density of the fibers distributed within the matrix material is generally proportional to the rate of solidification.

It has been recognized that such fiber arrays would be very useful for optical transmission if light could be made to travel down the fibers and kept out of the matrix. The advantages of such an application stem from the fact that the density of fibers in the eutectic system is greater than that which is presently achievable by bundling together a plurality of discrete optical fibers. The process of forming an array of many fibers by the directional solidification of a single eutectic system is less complicated and offers savings over the formation of individual fibers and subsequent formation of such fibers into a bundle. Also, the typical hexagonal fiber arrangement is very desirable in terms of maximizing fiber density.

Unfortunately, while many different eutectic systems have been directionally solidified to form fibers within a surrounding matrix, the fibers have generally been characterized by a lesser refractive index than the matrix material, and therefor were incapable of containing light. The single known achievement of a fiber optic eutectic microstructure in a prior art was in an Abstract published by the present inventors at the June 1976 American Association of Crystal Growth/West 1976 Meeting. This abstract disclosed a $MgF_2$-MgO eutectic system which exhibited optical fibers after directional solidification. The waveguide properties of the system were noted, and its use in conjunction with cathode ray tube (CRT) mosaics and integrated optics was suggested.

While the above specific system represented the first known prior art example of a eutectic system forming an array of optical fibers, the particular system was a type I eutectic. With this type of eutectic system, in which the coupled region does not include the eutectic composition at any except the eutectic temperature, it is considerably more difficult to achieve a satisfactory microstructure than for a type II eutectic system, which includes the eutectic composition at all temperatures. Furthermore, no single eutectic system would be optimal for all optical fiber applications, since the properties of some systems would be expected to be more suitable for certain applications and the properties of other systems more suitable for other applications.

Accordingly, there is still an unsatisfied need for a directionally solidified fiber optic eutectic system of the type II category, as well as a need for a variety of such systems so that a selection may be made between systems to identifiy the ones more suitable for a particular application.

SUMMARY OF THE INVENTION

In view of the above problems associated with the prior art, the principal object of the present invention is the provision of a type II directionally solidified eutectic system characterized by a fiber phase having optical transmission qualities within a surrounding matrix phase, and a method for forming such a system.

It is another object to provide an optical fiber array in which the fibers have very small diameters and a very high density of packing.

Another object is the provision of a readily formed optical fiber array in which all of the fibers are formed simultaneously.

Other objects include the provision of a directionally solidified, type II eutectic system with optical fibers in conjunction with useful applications for same, including a CRT, waveguide, fiber optic image intensifier, and laser system.

In satisfaction of the above objects, a eutectic system is provided which is directionally solidified to form a plurality of mutually spaced, optical fibers within a matrix material. The matrix and fiber materials comprise components of a type II eutectic system, the fiber material being characterized by a lesser molecular weight but greater refractive index than the matrix material. Such a choice of materials has been found to eliminate those type II eutectic systems which form fibers when directionally solidified, but in which the fibers are not optically transmitted within the surrounding matrix. particular eutectic systems which have been identified as coming within the terms of the invention include $CaF_2$-MgO and KF-LiF.

Several applications for the novel fiber optic eutectic are described. In one, a fiber optic waveguide is formed by directionally solidifying the eutectic system in an elongate shape extending generally along an axis. The optical fibers are distributed within the matrix substantially colinear with the system axis.

In another application a high resolution screen suitable for use with a CRT is obtained by forming the directionally solidified eutectic system into a fiber optic mosaic. A fluorescent coating is provided over one of the mosaic surfaces for receiving an electron beam. The optical fibers extend across the mosaic from the fluorescent coating to a screen surface on the opposite side of the mosaic to provide a high resolution image on the screen.

In another application, a similar fiber optic mosaic is used as a micro-channel plate for a fiber optic image intensifier. The fiber material is removed from a portion of each channel between the light receiving surface and an inward location within the plate, and th exposed walls of the channels optionally coated with a fluorescent coating to provide an enhanced source of secondary electron emissions for intensifying electron radiation entering the channel from the light receiving surface. A fluorescent coating at the inward end of each optical fiber functions as a micro-screen, with the optical fiber portions of the various channels transmitting a high resolution intensified image.

In a further application, a directionally solidified fiber optic eutectic system provides a lasing medium for a laser. The fiber phase of the eutectic serves as a host for a lasing material which is distributed through the fibers in sufficient quantity to initiate the lasing action when a radiation source is actuated.

Further objects, features and advantages of the invention will be apparent from the ensuing detailed description, considered in conjunction with the accompanying drawings.

DESCRIPTION OF THE DRAWINGS

FIG. 6 is a cross-sectional diagram of a section of a prior art CRT screen;

FIG. 7 is a diagram illustrating an improved CRT with a screen formed in accordance with the present invention;

FIG. 8 is a cross-sectional view of a section of a fiber optic image intensifier constructed in accordance with the present invention; and FIG. 9 is a diagram of a laser system employing a eutectic lasing rod constructed in accordance with the present invention.

DETAILED DESCRIPTION OF PREFERRED EMBODIMENTS

Figure 1:
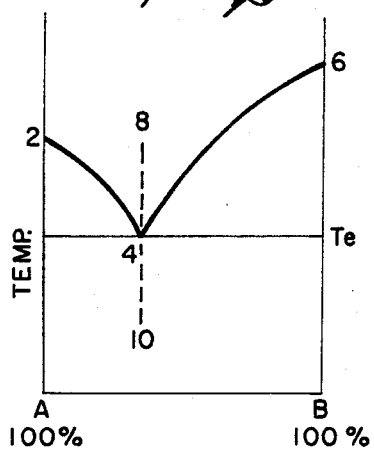
FIG. 1 is a phase diagram of a typical binary eutectic system.

Referring to FIG. 1, a typical phase diagram for a eutectic system consisting of two components A and B is shown. If a liquid mixture of the two components is cooled, solid will begin to separate at the freezing point for the particular mixture. The actual value of the freezing point will depend on the composition of the liquid mixture. If the results for a series of mixtures of components varying from pure A to pure B are plotted against the corresponding compositions, two liquidi curves 2-4 and 6-4 are obtained. The points 2 and 6 on the temperature axes are the respective freezing points of the pure components A and B; the addition of B to A lowers the freezing point of the mixture along curve 2-4, and similarly component A added to B lowers the freezing point of the resulting mixture along curve 6-4.

If the freezing point and composition of a given mixture are such as to fall on the curve 2-4, pure A will separate out from the mixture as a solid. On the other hand, if the freezing system is represented by a point on curve 6-4, pure solid B will separate from the liquid. The liquidi curves 2-4 and 6-4 may be regarded as representing the conditions of temperature under which the liquid phases of compositions having varying proportions of A and B are in equilibrium with the solid phase A or the solid phase B, respectively.

The point 4, where the two curves meet, is known as the eutectic point. A composition having the relative proportions of A and B at this point is known as a eutectic composition. The cooling of a eutectic composition from a liquid to a solid state is represented by dashed line 8-10. The temperature at the eutectic point is defined as the eutectic temperature.

The compounds forming a eutectic composition separate into distinct phases when solidified. Various microstructures, such as a homogeneous array of aligned fibers or lamellae can be produced by unidirectionally solidifying many eutectic compositions. Various techniques of unidirectional solidification are known in the art, the two most common methods being the Bridgman and Czochralski techniques. In the first mentioned technique a hot zone, formed either by induction or resistive heating, is moved relative to a eutectic composition within a crucible. As the hot zone passes, the composition is cooled and solidifies into separate phases. In the second technique, the crystal is pulled out of a melt held in a crucible, with the crystal solidifying as it leaves the crucible.

Figure 2:
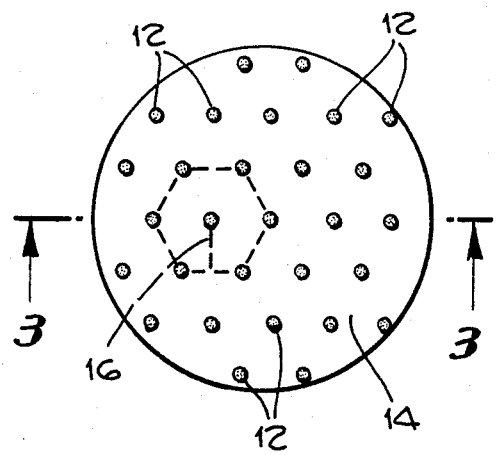
FIG. 2 is a cross-sectional view of a directionally solidified, fiber forming eutectic.

Fibers formed by directional solidification of a eutectic composition are typically arranged in a hexagonal array. FIG. 2 illustrates the cross-section of a fiber ingot. One phase of the eutectic is formed into a plurality of fibers 12 distributed within a matrix 14 comprising the other phase. The hexagonal packing arrangement is illustrated by dashes between adjacent fibers forming a hexagon, with a single fiber in the center. The interfiber separation is measured along the dashed line 16. As seen in the diametric cross-section of the ingot in FIG. 3, fibers 12 extend substantially colinear with the ingot axis and are uniformly distributed.

Given a phase diagram for a particular eutectic composition, it is possible to predict whether or not that composition will form fibers when directionally solidified. Unfortunately, phase diagrams are not presently available to the art for many eutectic compositions, and accordingly it is necessary to test such compositions on a trial and error basis to determine whether or not they will form fibers. It has been discovered by the inventors hereof that, for those eutectic compositions which do form fibers, the fiber component is always the one with the lower molecular weight, whereas the component with the higher molecular weight forms the matrix. While a definitive explanation of this phenomenon is subject to question, the following explanation appears to be reasonable at the present time.

When two compounds capable of producing a fiber eutectic are mixed at the eutectic composition they will phase separate during solidification. While in the liquid state lighter molecules are more mobile; accordingly, they can diffuse through the eutectic liquid at a faster rate than the molecules of the heavier components. The fiber forming molecules must be able to travel a much greater distance than those forming the matrix for a given time, and therefor the lighter more mobile molecules will form the fiber phase.

To serve as optical fibers within the matrix, the fiber phase must have a refractive index which is higher than that of the matrix phase. Thus, any eutectic composition having first and second components may be considered to form a fiber optic array when directionally solidified if:

(1) a fiber phase is formed when directionally solidified;

(2) the fiber phase has a lower molecular weight than the matrix phase; and (3) the fiber phase has higher refractive index than the matrix phase.

The great majority of eutectic systems so far known to form fibers when directionally solidified have a fiber phase with a lesser refractive index than the matrix phase. Such systems, to which attention has generally been devoted in the prior art, may in reality be eliminated from consideration for optical fiber applications.

It is preferable that the eutectic composition forming the optical fibers be of Type II, rather than Type I. The distinction between the two types was summarized in the article by M. Hogan, R. W. Kraft and F. D. Lemkey, "Eutectic Grains", Advances in Materials Research, H. Herman, ed., New York, Wiley, pp. 83-216, 1972. The distinction relates to the nature of the coupled region for each type.

Figure 4:
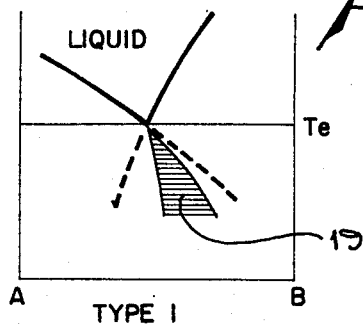
FIGS. 4 and 5 are phase diagrams of typical Type I and Type II eutectic systems, respectively.
Figure 5:
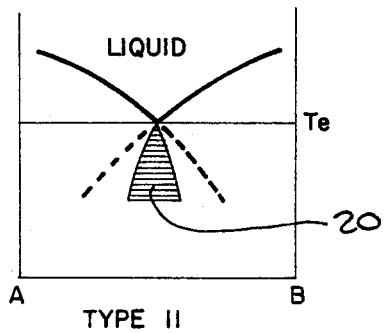

Referring to FIGS. 4 and 5, phase diagrams for Type I and Type II eutectic compositions are shown, respectively. In the Type I composition of FIG. 4, the coupled region 18 shown by cross hatching does not include the eutectic composition at any except the eutectic temperature. This phenomenon has been observed when the liquidi are strongly asymmetric about the eutectic point, which is the same situation that favors abnormal microstructures in metallic eutectics.

The Type II composition of FIG. 5 has a coupled region 20 which includes the eutectic composition at all temperatures and has been found to be associated with roughly symmetrical liquidi, which favor a normal microstructure in metallic eutectics.

Two Type II eutectic compounds forming optical fibers when directionally solidified have been identified. In one composition, MgO separates into the fiber phase and $CaF_2$ separates into the matrix phase. The fiber phase comprises 10.0 percent by weight, 9.1 percent by volume and 17.8 percent mole of the system. The difference in refractive index between fiber and matrix phases is 0.26. Using the Bridgman directional solidification technique, an induction furnace was used to heat a graphite crucible and melt and eutectic contained therein. An induction coil was moved upwards along the crucible axis, causing the solid/liquid interface to advance through the melt at 0.38 inches per hour. The temperature difference across the solid/liquid interface was maintained at 90° plus or minus 10° C. The solidified eutectic ingot was then removed from the crucible and cut into several cylindrical disks. Fiber diameters of three micrometers with interfiber separations of seven micrometers were observed.

Another fiber forming eutectic composition meeting the requirement that a fiber forming phase have a greater refractive index as well as lesser molecular weight than the matrix phase is KF-LiF. In this composition LiF forms the fiber. Its proportion of the total eutectic system is 31 percent by weight, 29 percent by volume, and 50 percent mole. The difference in refractive index between the fiber and matrix phases is 0.05. All alkali-halides such as KF are known to have good secondary electron emission coefficients, and therefore would be useful candidates for fiber optic image intensifiers as described below. However, KF has not been accurately studied for secondary electron emission coefficient because of its characteristic absorption of moisture (delliquesence).

The fiber diameter and interfiber separation (related to density) observed for the $CaF_2$-MgO system was a consequence of the particular speed at which the induction coil was moved along the crucible axis. Smaller fiber diameters but a higher density (more fibers) could be attained by moving the coil faster, while the reverse effects would accompany a slower movement of the coil. Accordingly, the fiber diameter and density may be controlled in accordance with the desired application by controlling the rate of directional solidification.

APPLICATIONS

(1) CRT Mosiac

The unique directionally solidified fiber optic eutectic of the present invention offers considerable advantages over presently available vidicons or drawn glass fiber mosaics. Production techniques are simpler, and cost of production is less because of the simpler techniques and decreased production time. Very fine detail, high resolutions screens can be achieved as a result of the high fiber density.

For special applications where high image resolution and low information loss is of paramount importance, eutectic CRT mosaics could be incorporated into electronic vidicons, thereby eliminating the need for computer image enhancement of deep space and satellite images. Another advantage is that such images can be processed as quickly as they are received. Furthermore, large grain photographic plates can be used because the eutectic mosaic screen resolution is superior.

Referring to FIG. 6, a section of a typical prior art CRT screen 22 is illustrated. On the rear surface of the screen facing an electron beam source is a phosphor coating 24. Electron beams incident on the phosphor coating 24 cause divergent light cones 26 to be transmitted to the viewing surface of the screen. Image resolution is limited due to the expanding diameter and interaction of the light cones.

An improved CRT employing a fiber optic eutectic mosaic according to the present invention is illustrated in FIG. 7. An electron beam source 28 emits a beam which is directed by charged capacitor plates 30 to a screen 32. On the rear of screen 32 is a fluorescent coating 34, such as phosphor, which in turn has a silvered coating to prevent phosphor emission in the wrong direction. An electron beam striking the phosphor coating causes light to be emitted into an adjacent fiber 36 within the screen matrix. The light is collimated by the fiber and transmitted to the viewing surface of the screen, where it emerges as a high resolution ray 38.

The improved CRT mosiac is prepared by mixing powders of a fiber forming Type II compound in the eutectic ratio. The mixture is placed in a crucible, melted, and directionally solidified by a known technique. The resulting ingot is removed from the crucible and cut into sections of desired thickness. The cross-sectional area and perimeter geometry of each ingot is controlled by the crucible dimensions, while the fiber diameters and density are controlled by the rate at which the ingot is directionally solidified. Several CRT mosaics can thus be produced from a single ingot, or several ingots of relatively small cross-section may be cut and bonded together to form a mosaic with a desired larger cross-section.

(2) Wave Guide

Wave guides formed from a bundle of optical fibers have shown great promise, especially in the communications field. However, low loss glass fibers are presently expensive to manufacture because solid cladding-liquid core glass fibers of different refractive indices must be drawn simultaneously. Other methods such as drawn claddings with removable cores, wherein a metal is vapor deposited on the interior surface and the cladding then heated and drawn have been attempted. This method does give the core a higher refractive index.

Figure 3:
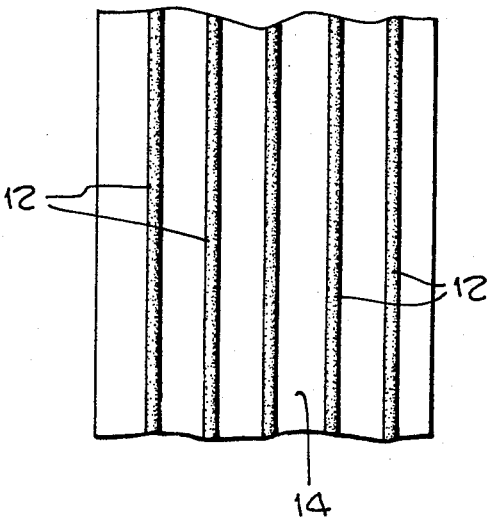
FIG. 3 is a cross-sectional view taken along the line 3—3 of FIG. 2.

A directionally solidified Type II eutectic wave guide, a portion of which is illustrated in cross-section in FIG. 3, offers several advantages over drawn glass fibers. An entire cable can be drawn in a single step, rather than drawing individual fibers and then combining the fibers to form cables. A much higher fiber density and lower fiber diameter is possible, with a diameter of one thousand angstroms being achievable in principle. Aside from providing a greater number of separate communication lines, high density and low diameter fibers increase the range of infra red radiation which can be transmitted, thereby broadening the base of laser wave lengths that can be used in an optical communication system. In addition, the large differential in refractive index between fiber and matrix reduces losses at the fiber/matrix interface, especially at bends.

(3) Fiber Optic Image Intensifier

A. Directionally solidified fiber-forming eutectics selected in accordance with the present invention may also be considered for use in a fiber optic image intensifier. While present photoceram and drawn glass techniques have a greater fiber volume density, approximately 60% as opposed to a maximum of about 33% for eutectics, smaller diameter fibers are achievable with the eutectic system. Since the efficiency of secondary electron emission is inversely proportional to channel diameter, image intensification can be enhanced with a eutectic system. The greater fiber density will also result in higher resolution.

A fiberoptic image intensifier constructed in accordance with the present invention is illustrated in FIG. 8. A plurality of fibers 40 are formed within a matrix 42 as described above, with the fiber material being of lower molecular weight but higher refractive index than the matrix material. The left side 44 of the image intensifier comprises a light receiving surface, while the right side 46 comprises a light transmitting surface.

The light receiving surface 44 of the resulting microchannelplate 48 is treated with a chemical etchant which attacks and removes the fiber phase from surface 44 to an inward location within plate 48, after an appropriate etching. The plate is cleaned, polished and the etched side treated with a phosphor coating which overlays the inward ends 50 of the fiber material remaining in the plate.

It has been found advantageous to employ a KF-LiF eutectic composition for this application, with the fibers being formed from LiF. However, other optical fiber-forming eutectic systems could be used so long as the matrix phase exhibits a satisfactory secondary electron emission coefficient so as to intensify electron radiation received in the channel 40. Enhanced image intensification may be achieved by coating the portions of the micro-channels not occupied by fiber material with a fluroescent coating.

In effect, the image intensifier just described moves the screen from an external location with respect to the micro-channel plate, to the phosphor coatings 50. This eliminates the problem of a blurry image on the screen which resulted from conical radiation patterns from prior art micro-channel plates to an associated screen.

(4) Laser

An optical fiber-forming eutectic system within the present invention may be used as a lasing medium for a conventional single crystal laser, replacing the crystal (typically ruby) previously used. The lower fiber diameters and colinear beams offer distinct advantages for both microelectronics and communications applications. While dual phase laser mediums are known, they are generally of the single or double heterostructure type, characterized by a lamellar structure in which the light beam is contained in one direction transverse to the direction of propagation but is free to spread out in the other transverse direction.

A pulsed laser system of conventional construction but with a eutectic lasing medium is shown in FIG. 9. The invention is not limited to such a construction, however, and the subject lasing medium may be employed in continuous wave lasers also. An elongate eutectic rod 52 having high density, unidirectionally solidified optical fibers therein is located within a cooling system 54. A flash lamp 56 encircles the eutectic 52, and is periodically flashed by the discharge from a capacitor bank 58 connected to a power supply 60. A reflecting mirror 62 is placed at one end of the rod, and a partially transmitting mirror 64 is placed at the other end of the rod. In response to light pumping by flash lamp 56, a laser beam 66 is transmitted out of the system through mirror 64.

In order to achieve lasing action, a small amount of lasing material such as NiO must be added to the host fiber in the eutectic. A suitable lasing material must form either a solid solubility or isomorphous phase diagram with the host fiber material. In general, no more than one percent by atomic weight of the fiber will be lasing material; greater concentrations tend to spread the photon response of the laser ions over too wide a wavelength range to be effective.

Numerous modifications and variations of the directionally solidified fiber optic eutectic, method for forming the same, and applications thereof will be apparent to one skilled in the art from a study of the foregoing specification. Accordingly, it is intended that the present invention be limited only in terms of the appended claims.

We claim:
1. A directionally solidified, optically conductive eutectic system, comprising:
   a matrix material comprising a first component of a type II eutectic system, and
   a plurality of mutually spaced, optical fibers within said matrix material, said fibers being formed from a second material component of said type II eutectic system, said fiber material being characterized by a lesser molecular weight but greater refractive index than said matrix material.
2. The system of claim 1, wherein said fibers are substantially colinear.
3. The system of claim 1, wherein said fibers are arranged substantially in a packed hexagonal array.
4. The system of claim 1, the diameter of said fibers being no greater than about 3 micrometers.
5. The system of claim 1, said matrix material comprising $CaF_2$, and said fiber material comprising MgO.
6. The system of claim 1, said matrix material comprising KF, and said fiber material comprising LiF.
7. A fiber optic waveguide, comprising:
   an elongate, directionally solidified eutectic system extending generally along an axis, said system comprising a matrix and a plurality of optically conductive fibers disturbed within said matrix substantially colinear with the system axis, said matrix and fibers being formed respectively from materials comprising the components of a type II eutectic system, said fiber material being characterized by lesser molecular weight but greater refractive index than said matrix material.

8. In a cathode ray tube having an electron beam source and means controlling the direction of a beam emitted by said source, the improvement comprising a high resolution screen adopted to be illuminated by said beam, said screen comprising:

a fiber optic mosaic having a first surface facing the electron beam source and a second surface opposite said first surface forming a screen, said mosaic comprising a matrix and a plurality of optically conductive fibers distributed within and extending across said matrix from said first to said second surface, said matrix and fibers being formed respectively from materials comprising the components of a type II eutectic system, said fiber material being characterized by a lesser molecular weight but greater refractive index than said matrix material, said fibers being substantially colinear and of sufficient density to transmit a high resolution image, and a fluorescent coating over said first mosaic surface positioned to receive an electron beam, and in response thereto to emit light into said mosaic.

9. A high resolution video screen, comprising:

a fiber optic mosaic having a pair of opposed surfaces, one of said surfaces forming a screen, and a flourescent coating over the other of said surfaces, said coating being adapted to emit light into said mosaic in response to its being illuminated by an electron beam;

said mosaic comprising a matrix and a plurality of optically conductive fibers distributed within and extending across said matrix between said opposed surfaces, said matrix and fibers being formed respectively from materials comprising the components of a type II eutectic system, said fiber material being characterized by a lesser molecular weight but greater refractive index than said matrix material, said fibers being substantially colinear and of sufficient density to transmit a high resolution image to the screen surface.

* * * * *